United States Patent [19]

Yang

[11] Patent Number: 5,488,004
[45] Date of Patent: Jan. 30, 1996

[54] SOI BY LARGE ANGLE OXYGEN IMPLANT

[75] Inventor: Ming-Tzong Yang, Hsin Chu, Taiwan

[73] Assignee: United Microelectronic Corporation, Hsinchu, Taiwan

[21] Appl. No.: 311,261

[22] Filed: Sep. 23, 1994

[51] Int. Cl.$^6$ .......................... H01L 21/76; H01L 21/265
[52] U.S. Cl. .................. 437/35; 437/24; 437/62; 437/41
[58] Field of Search .................. 437/24, 26, 29, 437/35, 62, 69, 99, 41 R

[56] References Cited

U.S. PATENT DOCUMENTS

| | | | |
|---|---|---|---|
| 4,912,062 | 3/1990 | Verma | 437/69 |
| 4,975,126 | 12/1990 | Margail et al. | 145/33.2 |
| 5,223,445 | 6/1993 | Fuse | 437/24 |
| 5,278,077 | 1/1994 | Nakato | 437/24 |
| 5,298,434 | 3/1994 | Strater et al. | 437/24 |
| 5,320,974 | 6/1994 | Hori et al. | 437/35 |
| 5,346,836 | 9/1994 | Hisamoto et al. | 437/919 |
| 5,346,841 | 9/1994 | Yajima | 437/35 |
| 5,350,700 | 9/1994 | Yang et al. | 437/31 |

FOREIGN PATENT DOCUMENTS

| | | | |
|---|---|---|---|
| 324727 | 2/1991 | Japan | 437/69 |
| 4215441 | 8/1992 | Japan | 437/69 |
| 5121401 | 5/1993 | Japan | 437/69 |
| 5175190 | 7/1993 | Japan | 437/69 |

OTHER PUBLICATIONS

"A Fully Depleted Lean–Channel Transistor (Delta)", by Hisamoto et al, IEEE Electron Derice Letters, vol. 11, No. 1 Jan. 1990.

"Selectively Implanting Oxygen Isolation Technology (SIO)", pub in Electronics Letters, May 9, 1985, vol. 21, No. 10, pp. 442–443.

Primary Examiner—George Fourson
Assistant Examiner—S. Mulpuri
Attorney, Agent, or Firm—George O. Saile; Rosemary L. S. Pike

[57] ABSTRACT

A new method of forming a silicon-on-insulator device using large tilt-angle implant is described. A first silicon oxide layer is formed on the surface of a semiconductor substrate. A first layer of tungsten is deposited over the silicon oxide layer and patterned. The semiconductor substrate is etched where it is not covered by the patterned tungsten layer to provide a silicon pillar underlying the patterned tungsten layer. A second silicon oxide layer is formed on all exposed surfaces of the silicon pillar and the silicon semiconductor substrate. A second tungsten layer is deposited over all surfaces of the substrate and anisotropically etched to form spacers on the sidewalls of the silicon pillar. An oxygen ion implantation is performed at a tilt angle to form implanted regions within the semiconductor substrate wherein the implanted regions extend and intersect under the silicon pillar. The tungsten layers are removed and the substrate is annealed wherein the implanted regions are transformed into silicon dioxide regions. The silicon oxide layers are removed to complete formation of the silicon-on-insulator device in the manufacture of an integrated circuit.

26 Claims, 6 Drawing Sheets

SOI BY LARGE ANGLE OXYGEN IMPLANT

BACKGROUND OF THE INVENTION

1. Field of the Invention

The invention relates to the fabrication of integrated circuit devices, and more particularly, to a method of forming a silicon-on-insulator (SOI) device using a large angle implant of oxygen in the fabrication of integrated circuits.

2. Description of the Prior Art

In a first method of forming an epitaxial layer on an oxide layer, shown in FIG. 1, a silicon dioxide layer 2 is formed on the surface of the silicon substrate 1. Epitaxial silicon layer 3 is deposited overlying the silicon oxide layer 2. Crystal defects 4 may be found within the layer 3 because of the different structures of the crystal lattices of silicon and silicon dioxide.

FIG. 2 illustrates a second method of forming an insulating layer over an oxide layer. Silicon oxide layer 2 is formed on the surface of a silicon substrate 1. A layer of silicon 5 is deposited overlying the silicon oxide layer. Oxygen ions 6 are implanted at high energy and high dosage into the silicon layer and then annealed to form silicon dioxide layer 2 under the silicon layer 5. Some damage 7 may occur within the silicon layer 5 because of incomplete annealing.

In their article, "Fully Depleted Lean-Channel Transistor (DELTA)," by Hisamoto et al, *IEEE Electron Device Letters*, Vol. 11, No. 1, January 1990, the authors present a silicon-on-insulator device in which the oxide is formed in a furnace and the silicon is protected by a silicon nitride layer.

Ion implantation of dopants has been used by a number of workers in the art in the formation of isolation regions. U.S. Pat. No. 4,912,062 to Verma uses vertically implanted Sb, As, P, or B dopants to enhance oxide growth without a mask during the oxidation step. U.S. Pat. No. 4,975,126 to Margail et al shows vertical implantation of oxygen ions into a silicon wafer and heating to form an isolation layer of silicon dioxide within the wafer without a mask during oxidation anneal. The article, "Selectively Implanting Oxygen Isolation Technology (SiO)" published in *Electronics Letters*, May 9, 1985, Vol. 21, No. 10, pp. 442–443, shows vertical ion implantation of oxygen at the surface of a silicon wafer using a silicon nitride mask during oxidation.

Large tilt-angle implant processes have been used by a number of workers in the art. Related U.S. patent application Ser. No. 08/160,243, filed on Dec. 2, 1993 uses a large tilt-angle implant process to form a buried subcollector region in the fabrication of bipolar transistors.

SUMMARY OF THE INVENTION

A principal object of the present invention is to provide an effective and very manufacturable method of forming an insulator under the silicon in the fabrication of an integrated circuit.

Another object of the present invention is to provide a method of forming a silicon-on-insulator device in the fabrication of an integrated circuit.

In accordance with the objects of this invention the method of forming a silicon-on-insulator device using large tilt-angle implant is achieved. A first silicon oxide layer is formed on the surface of a semiconductor substrate. A first layer of tungsten is deposited over the silicon oxide layer and patterned. The semiconductor substrate is etched where it is not covered by the patterned tungsten layer to provide a silicon pillar underlying the patterned tungsten layer. A second silicon oxide layer is formed on all exposed surfaces of the silicon pillar and the silicon semiconductor substrate. A second tungsten layer is deposited over all surfaces of the substrate and anisotropically etched to form spacers on the sidewalls of the silicon pillar. An oxygen ion implantation is performed at a tilt angle to form implanted regions within the semiconductor substrate wherein the implanted regions extend and intersect under the silicon pillar. The tungsten layers are removed and the substrate is annealed wherein the implanted regions are transformed into silicon dioxide regions. The silicon oxide layers are removed to complete formation of the silicon-on-insulator device in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
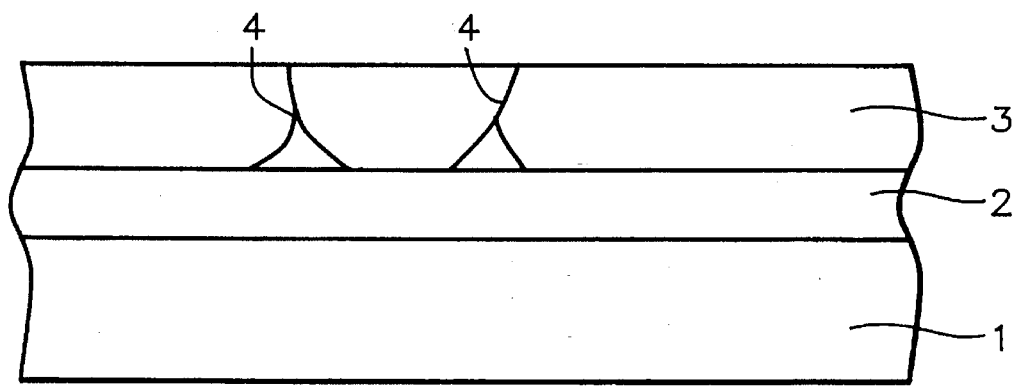
FIGS. 1 and 2 schematically illustrate in cross-sectional representation an integrated circuit of the prior art.
Figure 2:
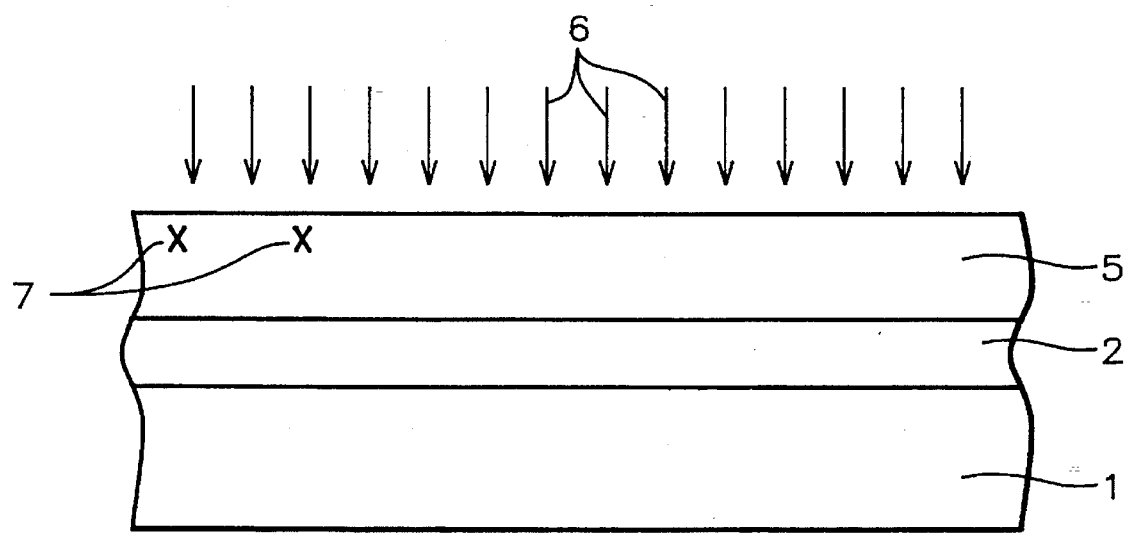
Figure 3:
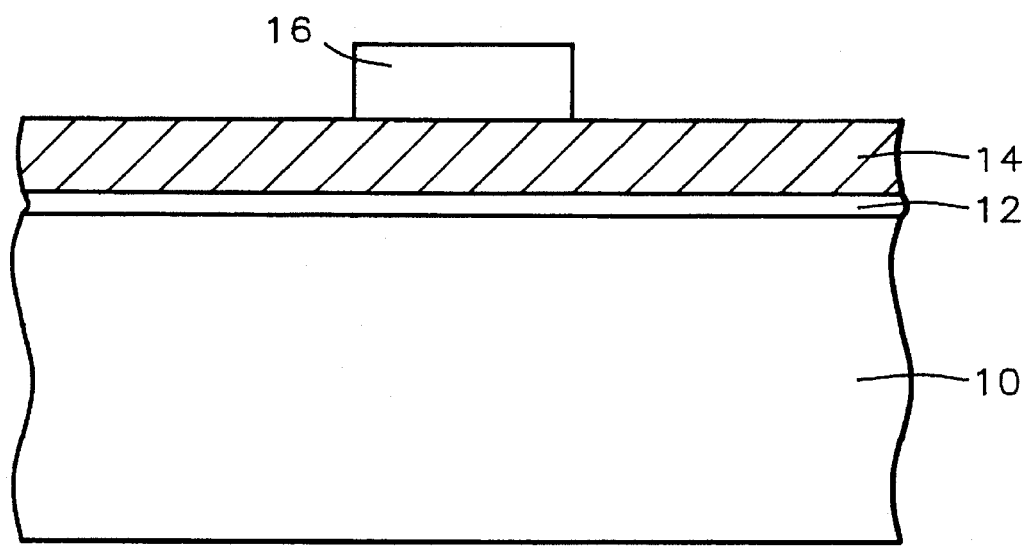
FIGS. 3 through 7, 9, 10, and 12 schematically represent in cross-sectional representation one preferred embodiment of the present invention.

Referring now more particularly to FIG. 3, there is shown an illustration of a portion of a partially completed integrated circuit in which there is a monocrystalline semiconductor substrate 10. The surface of the silicon substrate 10 is thermally oxidized to form a silicon oxide layer 12. This layer is between about 50 to 1000 Angstroms in thickness.

A tungsten layer 14 is deposited by chemical vapor deposition (CVD) to a thickness of between about 500 to 10,000 Angstroms. Tungsten silicide, titanium, titanium silicide, or silicon nitride could alternatively be used. W or $WSi_2$ are preferred. The layer 14 is coated with photoresist 16 which is patterned using conventional photolithography and etching techniques. The tungsten layer 14 is etched away where it is not covered by the photoresist mask.

Figure 4:
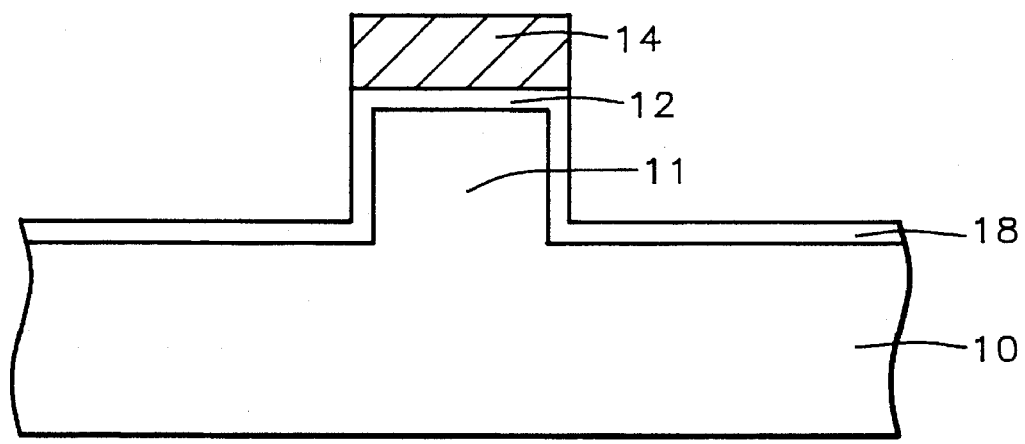

The silicon dioxide layer 12 and the silicon substrate 10 are etched away where they are not covered by the photoresist mask leaving a silicon pillar 11 topped with silicon dioxide 12 and tungsten layer 14, as illustrated in FIG. 4. The substrate is etched to a depth of between about 1000 to 20,000 Angstroms to form the silicon pillar 11. The photoresist mask is removed. The silicon 10 and 11 are oxidized to form a thin silicon dioxide layer 18 with a thickness of between about 50 to 1000 Angstroms.

Figure 5:
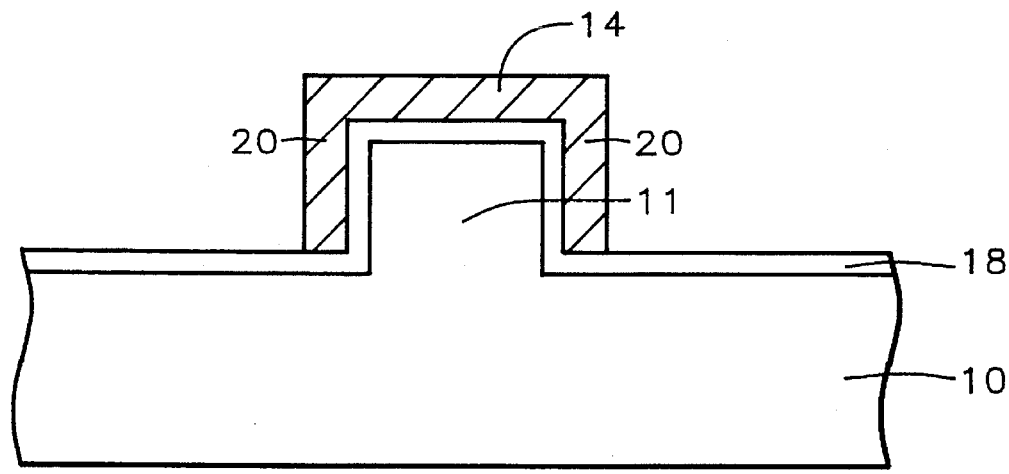

Referring now to FIG. 5, a second layer of preferably tungsten, or $WSi_2$, Ti, or $TiSi_2$, is deposited by CVD or sputtering to a thickness of between about 500 to 10,000 Angstroms. The tungsten layer is etched anisotropically using a reactive ion etch with fluorine-based chemistry to leave spacers 20 on the sidewalls of the silicon pillar 11.

Figure 6:
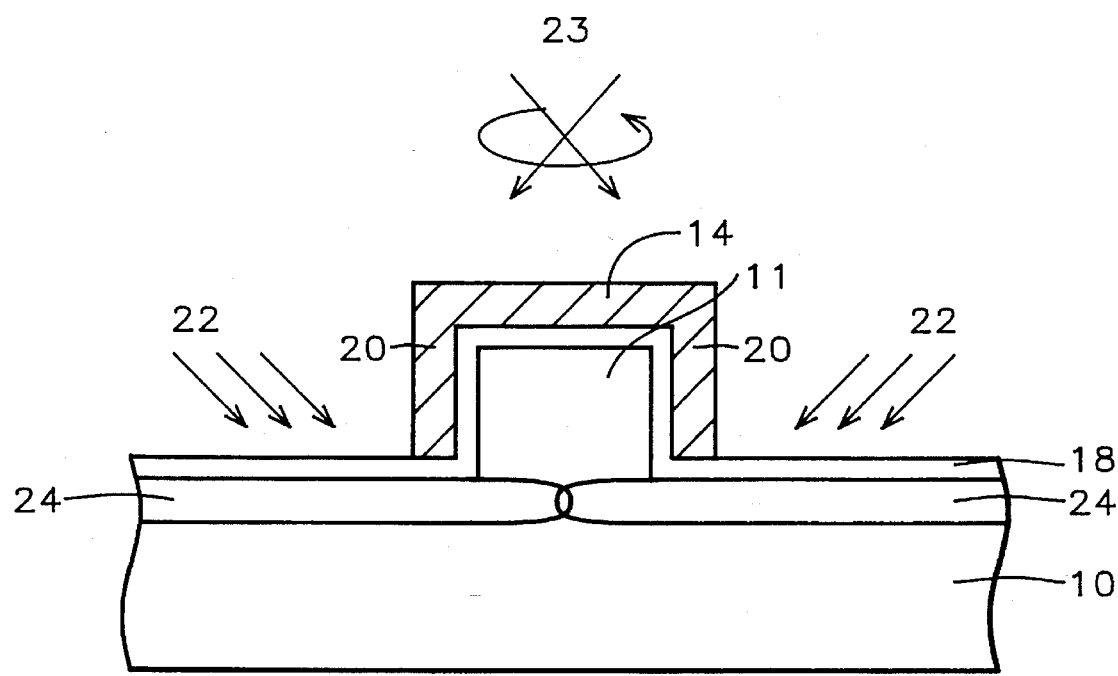

Referring now to FIG. 6, the critical large tilt-angle implant process will now be described. Oxygen ions 22 are implanted at an energy of between about 20 to 500 KeV and a dosage of between about 1 E 15 to 1 E 18 atoms/cm² with a tilt angle of more than about 7° and preferably between about 10° to 60°. 23 illustrates the rotation of the wafer during ion implantation. The wafer rotates at 0.2 to 20 rotations per second for 3 to 500 seconds so as to achieve a symmetrical implantation. The large tilt-angle implantation is critical so that oxygen ions are implanted under the silicon pillar 11.

The tungsten top layer 14 and sidewalls 20 prevent the oxygen implants from penetrating the silicon pillar 11 which will form the silicon-on-insulator device. The oxygen ions penetrate the silicon substrate to form implanted regions 24 just under the surface of the silicon dioxide layer 18 and intersecting underneath the silicon pillar 11.

Figure 7:
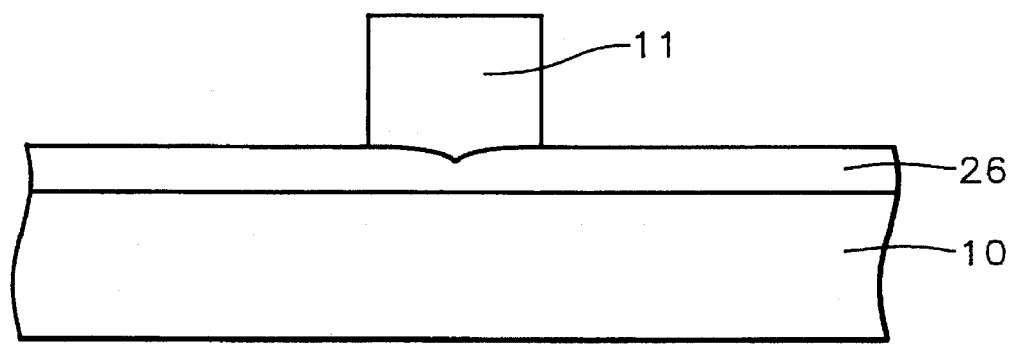

Referring now to FIG. 7, the tungsten layers 14 and 20 are removed by a wet stripping process. The silicon substrate is annealed at a temperature of between about 700° to 1200° C. for between about 5 to 1000 minutes. The implanted regions 24 will form field oxidation regions 26. The silicon dioxide layer 18 is removed by a hydrofluoric acid solution or buffered oxide etch to complete formation of the silicon-on-insulator device 11.

Figure 8:
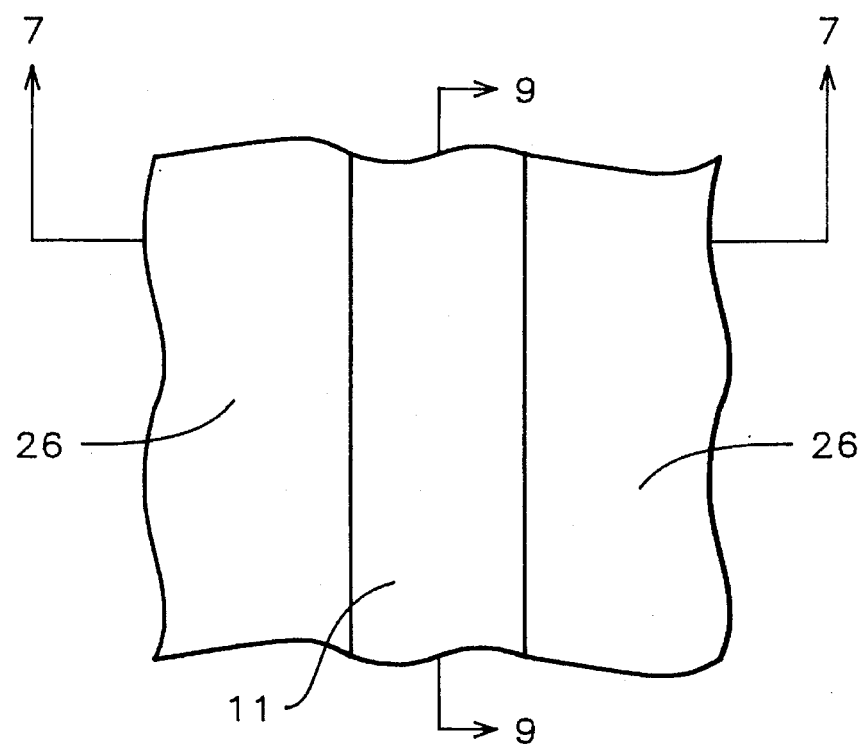
FIGS. 8 and 11 schematically represent top views of one preferred embodiment of the present invention.
Figure 9:
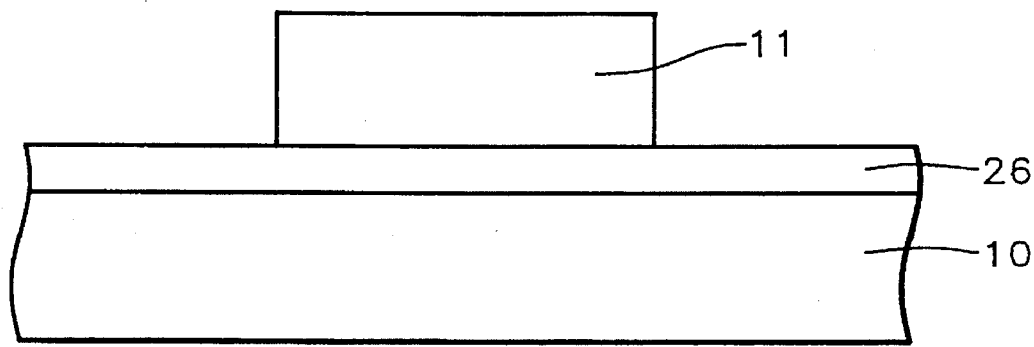

FIG. 8 illustrates a top view of the integrated circuit. The silicon-on-insulator device 11 is shown surrounded by field oxide regions 26. View 7—7 is shown in FIG. 7. View 9—9 is shown in FIG. 9.

Figure 10:
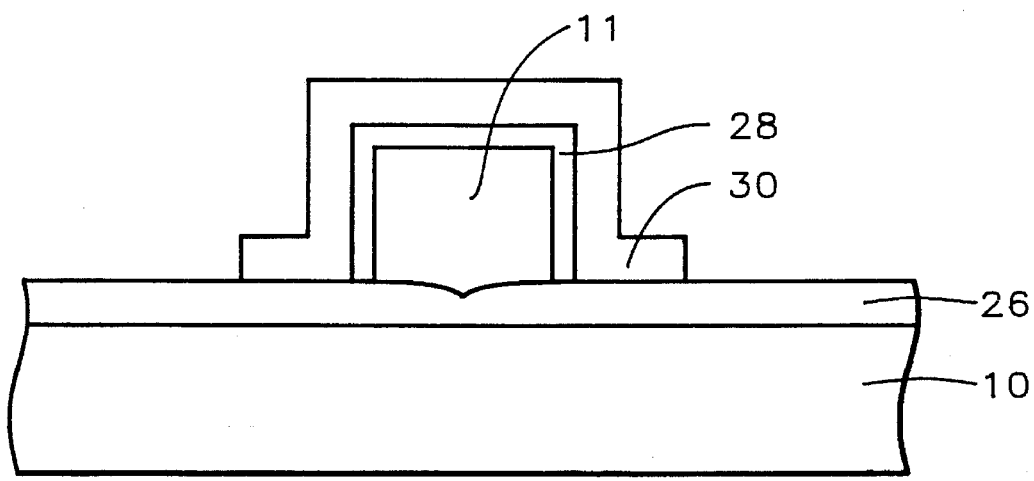

Referring now to FIG. 10, MOS devices may now be formed. The silicon-on-insulator device 11 is oxidized to form a thin gate oxide 28 with a thickness of between about 70 to 500 Angstroms. A layer of polysilicon 30 is deposited over gate oxide layer 28 by low pressure chemical vapor deposition (LPCVD) to a thickness of between about 500 to 5000 Angstroms and doped by $POCl_3$ in a furnace or by ion implantation. The polysilicon layer 30 is patterned using conventional photolithographic and etching techniques to form polysilicon gate electrode 30 as shown in FIG. 10.

Figure 11:
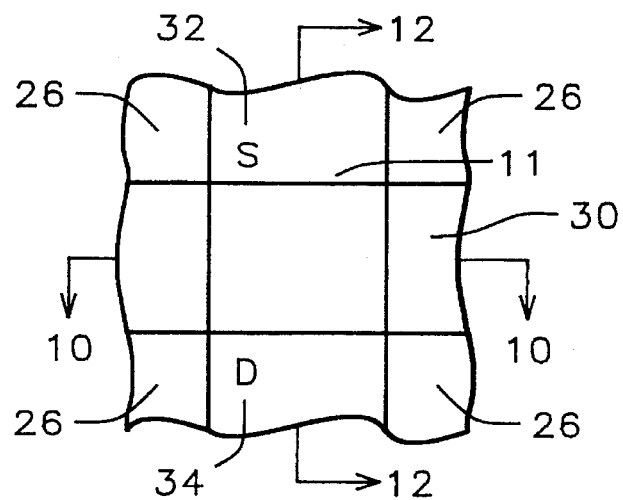
Figure 12:
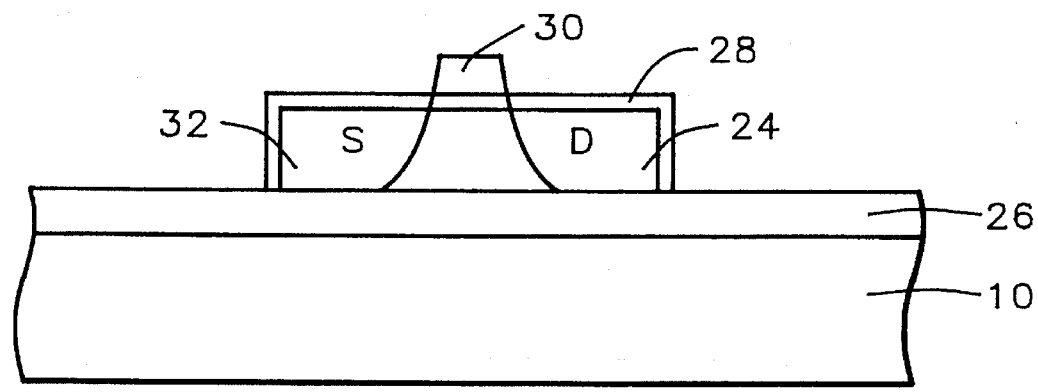

FIG. 11 is a top view of the integrated circuit illustrating silicon-on-insulator device 11 and gate electrode 30 surrounded by field oxide regions 26. FIG. 10 illustrates view 10—10 of this figure. View 12—12 is shown in FIG. 12. The silicon pillar 11 is implanted with B or $BF_2$ ions to form P+ source/drain regions or As or $P_{31}$ ions to form N+ source/drain regions are either said of gate electrode 30. The ions are implanted at an energy of between about 15 to 200 KeV and a dosage of between about 5 E 13 to 5 E 16 atoms/cm$^2$ to form source and drain regions regions 32 and 34, respectively. Processing continues as is conventional in the art to make contact to the semiconductor devices and source and drain regions with subsequent metallurgy to complete the silicon-on-insulator integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming a silicon-on-insulator device in the manufacture of an integrated circuit comprising:

forming a first silicon oxide layer on the surface of a semiconductor substrate;

depositing a first implant-stop layer over said silicon oxide layer and patterning said first implant-stop layer;

etching into said semiconductor substrate where said substrate is not covered by said patterned implant-stop layer to provide a silicon pillar underlying said patterned implant-stop layer;

forming a second silicon oxide layer on all exposed surfaces of said silicon pillar and said silicon semiconductor substrate;

depositing a second implant-stop layer over all surfaces of said substrate;

anisotropically etching said second implant-stop layer to form spacers on the sidewalls of said silicon pillar;

thereafter performing a single oxygen ion implantation using a single energy at a tilt angle to form implanted regions within said semiconductor substrate wherein said implanted regions are formed directly underneath said second silicon oxide layer overlying said semiconductor substrate and wherein said implanted regions extend and intersect under said silicon pillar;

removing said first implant-stop layer and said spacers;

annealing said semiconductor substrate wherein said implanted regions are transformed into silicon dioxide regions; and removing said first and second silicon oxide layers to complete formation of said silicon-on-insulator device in the manufacture of an integrated circuit.

2. The method of claim 1 wherein the thickness of said first silicon oxide layer is between about 50 to 1000 Angstroms.

3. The method of claim 1 wherein said implant-stop layer is composed of tungsten and has a thickness of between about 500 to 10,000 Angstroms.

4. The method of claim 1 wherein said silicon substrate is etched into to a depth of between about 1000 to 20,000 Angstroms to form said silicon pillar.

5. The method of claim 1 wherein said second implant-stop layer is composed of tungsten and is deposited to a thickness of between about 500 to 10,000 Angstroms.

6. The method of claim 1 wherein said oxygen ion implantation is performed at a dosage of between about 1 E 15 to 1 E 18 atoms/cm$^2$ and an energy of between about 20 to 500 KeV at a tilt angle of between about 7° to 80°.

7. The method of claim 1 wherein said oxygen ion implantation is performed while the wafer containing said silicon substrate is rotated at 0.2 to 20 rotations per second for between about 3 to 500 seconds for a symmetrical implantation.

8. The method of claim 1 wherein said substrate is annealed at a temperature of between about 700° to 1200° C. for between about 50 to 1000 minutes.

9. The method of forming a silicon-on-insulator device in the manufacture of a MOSFET integrated circuit comprising:

forming a first silicon oxide layer on the surface of a semiconductor substrate;

depositing a first implant-stop layer over said silicon oxide layer and patterning said first implant-stop layer;

etching into said semiconductor substrate where said substrate is not covered by said patterned implant-stop layer to provide a silicon pillar underlying said patterned implant-stop layer;

forming a second silicon oxide layer on all exposed surfaces of said silicon pillar and said silicon semiconductor substrate;

depositing a second implant-stop layer over all surfaces of said substrate;

anisotropically etching said second implant-stop layer to form spacers on the sidewalls of said silicon pillar;

thereafter performing a single oxygen ion implantation using a single energy at a tilt angle to form implanted regions within said semiconductor substrate wherein said implanted regions are formed directly underneath said second silicon oxide layer overlying said semiconductor substrate and wherein said implanted regions extend and intersect under said silicon pillar;

removing said first implant-stop layer and said spacers;

annealing said semiconductor substrate wherein said implanted regions are transformed into silicon dioxide regions;

removing said first and second silicon oxide layers to complete formation of said silicon-on-insulator device;

forming a gate silicon oxide layer on the surfaces of said silicon-on-insulator device and said semiconductor substrate;

depositing a layer of polysilicon over said gate silicon oxide layer and doping said polysilicon layer;

etching said polysilicon layer to form a polysilicon gate electrode; and implanting ions into portions of said silicon-on-insulator layer not covered by a mask to form source and drain regions completing the manufacture of said MOSFET integrated circuit.

10. The method of claim 9 wherein said first implant-stop layer is composed of tungsten and has a thickness of between about 50 to 1000 Angstroms.

11. The method of claim 9 wherein said silicon substrate is etched into to a depth of between about 1000 to 20,000 Angstroms to form said silicon pillar.

12. The method of claim 9 wherein said second implant-stop layer is composed of tungsten and is deposited to a thickness of between about 500 to 10,000 Angstroms.

13. The method of claim 9 wherein said oxygen ion implantation is performed at a dosage of between about 1 E 15 to 1 E 18 atoms/cm$^2$ and an energy of between about 20 to 500 KeV at a tilt angle of between about 7° to 80°.

14. The method of claim 9 wherein said oxygen ion implantation is performed while the wafer containing said silicon substrate is rotated at 0.2 to 20 rotations per second for between about 3 to 500 seconds for a symmetrical implantation.

15. The method of claim 9 wherein said substrate is annealed at a temperature of between about 700° to 1200° C. for between about 50 to 1000 minutes.

16. The method of claim 9 wherein said polysilicon gate electrode is formed along the top and sidewall surfaces of said silicon-on-insulator layer to a thickness of between about 500 to 5000 Angstroms.

17. The method of forming a silicon-on-insulator device in the manufacture of an integrated circuit comprising:

providing a patterned implant-stop layer on the surface of a semiconductor substrate;

etching into said semiconductor substrate where said substrate is not covered by said patterned implant-stop layer to provide a silicon pillar underlying said patterned implant-stop layer;

forming spacers of an implant-stop material on the sidewalls of said silicon pillar;

thereafter performing a single oxygen ion implantation using a single energy at a tilt angle to form implanted regions within said semiconductor substrate wherein said implanted regions are formed directly underneath said patterned implant-stop layer overlying said semiconductor substrate and wherein said implanted regions extend and intersect under said silicon pillar and wherein said implant-stop layer and said spacers prevent said ion implantation from entering said silicon pillar;

removing said implant-stop layer and said spacers; and annealing said semiconductor substrate wherein said implanted regions are transformed into silicon dioxide regions to complete formation of said silicon-on-insulator device in the manufacture of said integrated circuit.

18. The method of claim 17 wherein a silicon oxide layer is formed underlying said implant-stop layer and said spacers of said implant-stop material.

19. The method of claim 17 wherein said implant-stop layer is composed of tungsten and has a thickness of between about 500 to 10,000 Angstroms.

20. The method of claim 17 wherein said implant-stop layer is composed of tungsten silicide and has a thickness of between about 500 to 10,000 Angstroms.

21. The method of claim 17 wherein said silicon substrate is etched into to a depth of between about 1000 to 20,000 Angstroms to form said silicon pillar.

22. The method of claim 17 wherein said spacer implant-stop material is composed of tungsten and is deposited to a thickness of between about 500 to 10,000 Angstroms.

23. The method of claim 17 wherein said spacer implant-stop material is composed of tungsten silicide and is deposited to a thickness of between about 500 to 10,000 Angstroms.

24. The method of claim 17 wherein said oxygen ion implantation is performed at a dosage of between about 1 E 15 to 1 E 18 atoms/cm$^2$ and an energy of between about 20 to 500 KeV at a tilt angle of between about 7° to 80°.

25. The method of claim 17 wherein said oxygen ion implantation is performed while the wafer containing said silicon substrate is rotated at 0.2 to 20 rotations per second for between about 3 to 500 seconds for a symmetrical implantation.

26. The method of claim 17 wherein said substrate is annealed at a temperature of between about 700° to 1200° C. for between about 50 to 1000 minutes.

* * * * *